(12) United States Patent
Muneishi et al.

(10) Patent No.: US 8,347,744 B2
(45) Date of Patent: Jan. 8, 2013

(54) SAMPLE HOLDER, SAMPLE SUCTION DEVICE USING THE SAME, AND SAMPLE PROCESSING METHOD

(75) Inventors: Takeshi Muneishi, Higashiomi (JP); Toshihiko Uemura, Higashiomi (JP); Katsuya Okumura, Shinjuku-ku (JP)

(73) Assignees: Kyocera Corporation, Kyoto (JP); Okutec Co., Ltd., Tokyo (JP)

( * ) Notice: Subject to any disclaimer, the term of this patent is extended or adjusted under 35 U.S.C. 154(b) by 637 days.

(21) Appl. No.: 12/088,669

(22) PCT Filed: Sep. 28, 2006

(86) PCT No.: PCT/JP2006/319280
§ 371 (c)(1),
(2), (4) Date: Dec. 2, 2008

(87) PCT Pub. No.: WO2007/037316
PCT Pub. Date: Apr. 5, 2007

(65) Prior Publication Data
US 2009/0293647 A1  Dec. 3, 2009

(30) Foreign Application Priority Data

Sep. 28, 2005  (JP) .................................. 2005-282975
Mar. 28, 2006  (JP) .................................. 2006-087622

(51) Int. Cl.
*G01M 19/00* (2006.01)
(52) U.S. Cl. ....................................... 73/865.8
(58) Field of Classification Search .................. None
See application file for complete search history.

(56) References Cited

U.S. PATENT DOCUMENTS 6,863,281 B2  3/2005  Endou et al.
2003/0012523 A1*  1/2003  Shinozaki et al. .............. 385/92
2003/0173174 A1*  9/2003  Stephan et al. .................. 191/10

FOREIGN PATENT DOCUMENTS

| JP | 63232443 A | 9/1988 |
| JP | 5047906 A | 2/1993 |
| JP | 05047906 A | 2/1993 |
| JP | 05285764 A | 11/1993 |
| JP | 06204324 A | 7/1994 |
| JP | 09045753 A | 2/1997 |
| JP | 10070179 A | 3/1998 |
| JP | 10242255 A | 9/1998 |
| JP | 2003086664 A | 3/2003 |
| JP | 2005101247 A | 4/2005 |

OTHER PUBLICATIONS

International Search Report for corresponding PCT application No. PCT/JP2006/319280 lists the references above.
Japanese language office action dated Oct. 26, 2010 and its English language translation for corresponding Japanese application 2007537670 cites the references above.
Korean language office action dated Nov. 25, 2010 and its English language translation for corresponding Korean application 1020087004055 cites the references above.

* cited by examiner

*Primary Examiner* — Robert R Raevis
(74) *Attorney, Agent, or Firm* — DLA Piper (US) LLP

(57) ABSTRACT

Because a sample holder 100 is composed of a plurality of convex parts 1 provided on a top face of a base substance 2, and the plurality of convex parts 1 are spherical surfaces 1a formed of a single crystal or amorphous material, frictional wear of the sample at contact parts between a sample 4 and the convex parts 1 is reduced, thereby making it possible to inhibit particle generation. Further, because a joining layer 3 is formed of a single crystal or amorphous material, there is no defect that particles scattered on the sample holder 100 fill up it, which makes it possible to easily keep it in a clean state by cleaning, and it is possible to effectively reduce reattachment of particles to the sample 4.

16 Claims, 5 Drawing Sheets

SAMPLE HOLDER, SAMPLE SUCTION DEVICE USING THE SAME, AND SAMPLE PROCESSING METHOD

CROSS-REFERENCE TO RELATED APPLICATION

This application is a national phase of international application No. PCT/JP2006/319280 filed Sep. 28, 2006, the entire contents of which are incorporated by reference. This application also claims benefit of priority under 35 U.S.C. §119 to Japanese Patent Application Nos. 2005-282975 filed Sep. 28, 2005 and 2006-087622 filed Mar. 28, 2006, the entire contents of which are incorporated by reference.

TECHNICAL FIELD

The present invention relates to a sample holder holding a sample in respective manufacturing processes for silicon wafers used for the manufacture of semiconductor integrated circuits, glass substrates used for the manufacture of liquid crystal display devices and the like, and a sample suction device using the sample holder, and a sample processing method in which processes of grinding, inspection, carriage and the like are performed on the sample by use of the sample absorption system.

BACKGROUND ART

During the manufacturing process of a semiconductor integrated circuit, a sample such as a semiconductor wafer made of silicon or the like as a raw material is held several times on sample stages of a manufacturing apparatus, an inspection device and the like. As a method for holding a sample on a sample stage, various devices and various holding methods have been proposed in accordance with the types of manufacturing processes. As processes of holding a sample, for example, there are a process of grinding the sample into a flawless mirror plane, a process of partially exposing a photosensitive material called a resist which applied on a sample by light or an electron beam with a uniform wavelength, a process of eliminating the exposed resist, a process of inspecting the sample which has passed through the respective processes and the like. Further, the surrounding areas of sample stages on which a sample is held are in not only an air atmosphere, but also special gas atmospheres such as nitrogen and oxygen, and pressures thereof range widely from $1 \times 10^5$ Pa serving as atmospheric pressure to $1 \times 10^{-7}$ Pa called high vacuum.

With respect to conventional sample holders, a high corrosion-resistant material has been used as a material in accordance with these various processes and atmospheres, and a sample suction device working out by using mechanical force such as a spring, differential pressure, or electrostatic force has been used as a means for holding a sample.

In recent years, in accordance with further miniaturization and high-density technology of semiconductor integrated circuits, there have been recognized various problems that particles generated by frictional wear between the sample and a sample holder at the time of holding a sample attach to the sample, particles getting into flaws existing on the surface of the sample reattach sporadically due to external force such as vibration, and the like.

On these problems, conventionally, a method for decreasing contact areas between a sample and the sample holder, a method for reducing frictional wear by smoothing contact parts, a method for making contact parts with a sample into curved shapes, and further a method for grinding surfaces of contact parts by using abrasive grains or ultrasonic waves and the like have been used.

In Patent Document No. 1, there has been proposed a vacuum suction device in which a concave notched part is provided in one principal surface of a base substance formed of ceramics, and a plurality of protrusions are provided on the bottom surface of the concave notched part. These protrusions form various shapes. There are a circular truncated cone, a truncated pyramid, and a hemisphere which are taper shapes from the basic parts toward the top faces, or a shape in which cylindrical columns with different diameters are piled up, and the like. There is disclosed that the generations of particles and contaminants due to contacting a sample are greatly reduced by decreasing the areas of the tip faces of the protrusions, or by making the widths of the tip faces of the protrusions 0.1 mm.

In Patent Document No. 2, there has been disclosed a sample suction device in which a fixation plane to hold a sample is made to be a concavo-convex plane in which protrusions or grooves are formed on a base substance, and both of the top faces and the side faces of the convex parts of the concavo-convex plane and the bottom faces of the concave parts of the concavo-convex plane are grinded by using abrasive grains. In accordance therewith, the apical angle parts are decreased at contact portions with the sample on the fixation plane, and it is possible to inhibit particle generation. Further, there has been disclosed that it is possible to reduce reattachment of particles at the time of desorbing the sample held on the fixation plane from the fixation plane by a lift pin.

In Patent Document No. 3, there has been disclosed a sample suction device in which a holding part to hold a sample is capable of movement such as rotating, and it is possible to eliminate particles attaching to the holding part during movement. There has been disclosed a method for this sample suction device in which the holding part is made as a spherical body or a spinning roller to be sandwiched by a retainer, and particles attaching to the holding part are eliminated by rotating the holding part by directly moving the retainer.

In Patent Document No. 4, there has been disclosed a sample suction device in which a DLC (Diamond Like Carbon) film with a thickness of 3 to 40 μm is formed on a surface of a base substance, and defective parts and apical angle parts of the base substance are covered with the DLC film, which reduces particle generation due to wearing of a sample at the apical angle parts.

In Patent Document No. 5, there has been disclosed a vacuum chuck in which a chuck plane is formed from a large number of ceramic spherical bodies which are arrayed as one layer on a surface of a ceramic base substrate to be directly joined to the base substrate. It was disclosed that air intake holes are provided to gaps among the ceramic spherical bodies, and even if particles attach to the edges of the opening portions of the air intake holes, the particles are easily eliminated by suction from the air intake holes formed on the base substrate.

Patent Document No. 1: Japanese Unexamined Patent Publication No. 10-242255
Patent Document No. 2: Japanese Unexamined Patent Publication No. 2003-86664
Patent Document No. 3: Japanese Unexamined Patent Publication No. 10-70179
Patent Document No. 4: Japanese Unexamined Patent Publication No. 2005-101247
Patent Document No. 5: Japanese Unexamined Patent Publication No. 5-285764

DISCLOSURE OF THE INVENTION

Problems to be Solved by the Invention

However, in Patent Document No. 1, in order to decrease the areas of the tip faces of the protrusions, or make the widths of the tip faces of the protrusions be 0.1 mm, a large number of processes are required for their manufacture, and additionally, there is a limit in that the contact areas of the contact parts are processed to be smaller in these manufacturing processes.

In Patent Document No. 2, grinding by using abrasive grains are carried out onto both of the top faces and the side faces of the convex parts of the concavo-convex plane and the bottom faces of the concave parts of the concavo-convex plane. However, in a case in which there are a large number of fine convex parts, it is difficult to reduce flaws and apical angle parts in the peripheral parts of the convex parts, and it is impossible to sufficiently inhibit particle generation due to wearing of a sample.

Further, the bottom faces of the concave parts are grinded in accordance with the grinding of the peripheral parts of the convex parts of the concavo-convex plane, and its surface roughness is made less than or equal to 0.25 µm. However, in a case in which the base substance is made of ceramics, there are still the problems that particles are generated due to falling of grains attributed to a work-affected layer by grinding, and that particles filling up voids in the surface of the ceramics are liberated to attach to the sample, and the like.

In Patent Document No. 3, because the holding part is held as a spherical body or a spinning roller to be sandwiched by the retainer, it is difficult to eliminate particles attached to the retainer. Further, because the holding part is moved in a case of a prolonged use, there has been the problem that particles reattach to the holding part.

In Patent Document No. 4, there has been the problem that the DLC film on the surface of the base substance is deteriorated in the flatness of the sample holding part of the base substance to the extent of the order of its thickness, which makes it impossible to hold the sample precisely. Further, it is difficult to form the DLC film to have a thickness of 3 to 40 µm, and even if it is possible to form it, there has been the problem that the DLC film is easily peeled off.

In Patent Document No. 5, there are open pores in the surface of the ceramic spherical bodies, and the open pores have edges. Due to frictional wear between the sample and the spherical body, particles from the edges of the open pores are easily generated. Further, there has been the problem that particles filling up the open pores in the surface of the base substance and the spherical bodies are liberated to attach to the sample.

A pattern width in circuit wiring of a semiconductor integrated circuit is recently miniaturized to be approximately 100 nm. This means that if particles of approximately 0.1 µm, for example, attach to a sample during the manufacturing process of a semiconductor integrated circuit, this has an effect on the completed semiconductor circuit. A pattern width comes in predisposed to be further miniaturized, and particles to be generated are required to have smaller diameters. On the other hand, a minimum measurable particle diameter by a particle counter used for a clean room or the like is approximately 0.1 µm, and it is impossible to measure particles with particle diameters less than 0.1 µm. Therefore, recently, it has been required to restrain particles with particle diameters greater than or equal to approximately 0.1 µm from attaching to a sample.

An object of the present invention is to provide a sample holder capable of reducing particle generation due to frictional wear with a sample and the like, and that particles get into flaws or insides of voids to reattach to the sample sporadically, a sample suction device using the same, and a sample processing method using the same.

Means for Solving the Problems

A sample holder of the present invention which holds a sample by a plurality of convex parts provided on a top face of a base substance, and in the sample holder, the convex parts are, at least at contact faces with the sample, composed of spherical surfaces formed of a single crystal or amorphous material, and are fixed to the base substance via a joining layer formed of an amorphous material.

EFFECT OF THE INVENTION

In accordance with the structure of the present invention, because the plurality of convex parts are spherical surfaces formed of a single crystal or amorphous material, there are less defects such as voids in the spherical surfaces themselves of the convex parts, and because it is possible to smoothen the surfaces by polishing processing by using abrasive grains, it is possible to reduce frictional wear of the sample on the contact parts between the sample and the convex parts, which makes it possible to inhibit particle generation. Further, because the joining layer is formed of an amorphous material, it is possible to reduce the defect that particles scattered on the sample holder fill up it, which makes it possible to easily keep it in a clean state by cleaning, and it is possible to restrain particles from reattaching to the sample.

BRIEF DESCRIPTION OF THE DRAWINGS

FIGS. 2(b) to 2(d) are perspective views showing convex parts used for the sample holder of the present invention.

PREFERRED EMBODIMENTS FOR CARRYING OUT THE INVENTION

Sample Holder

An embodiment of a sample holder of the present invention will now be described.

Figure 1:
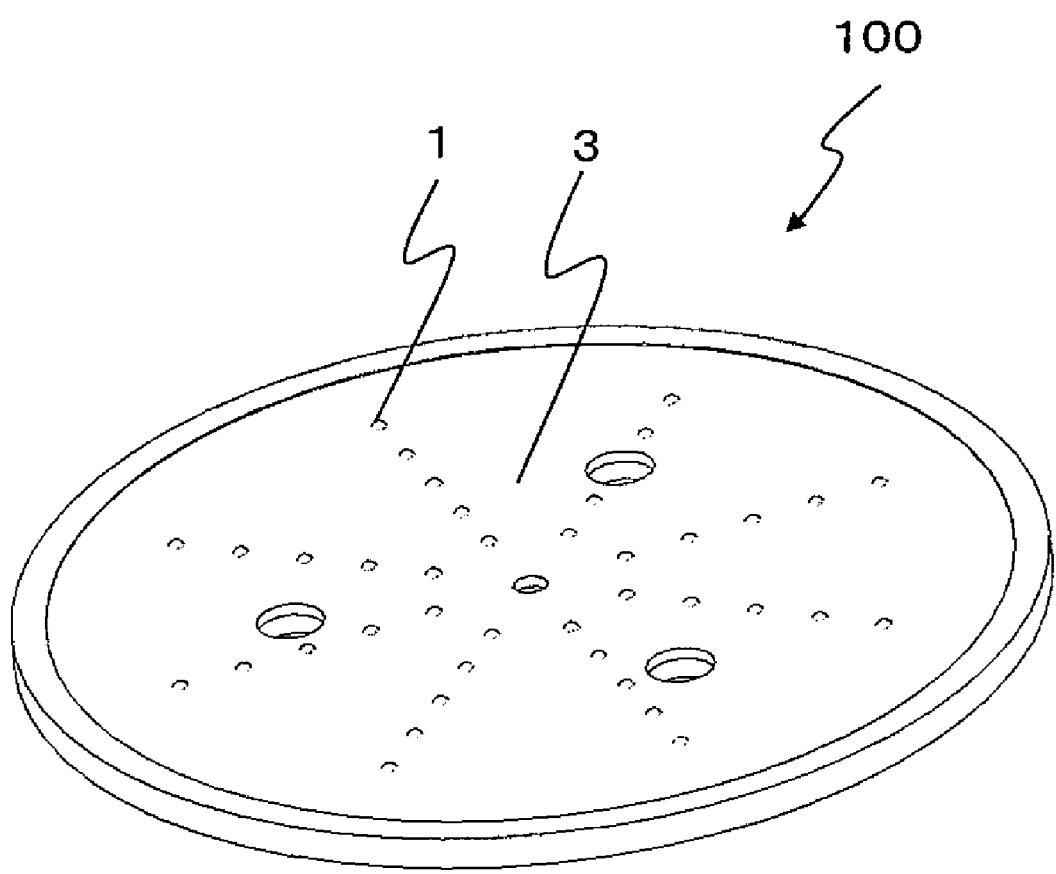
FIG. 1 is a perspective view showing an embodiment of a sample holder of the present invention.
Figure 2A:
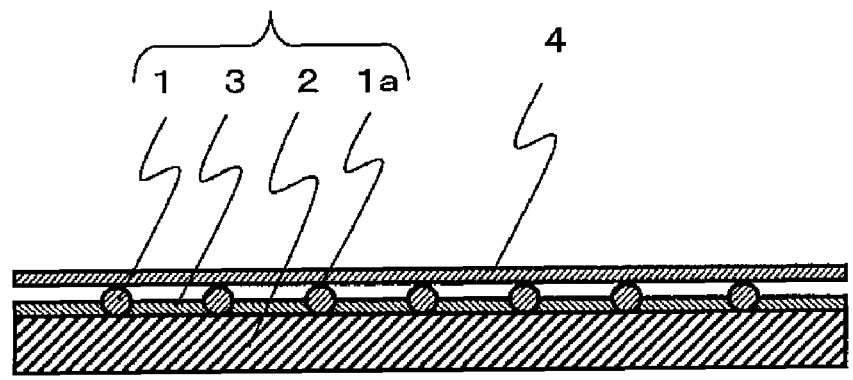
FIG. 2(a) is a partial cross-sectional view when a sample is mounted on the sample holder of the present invention.
Figure 2A:
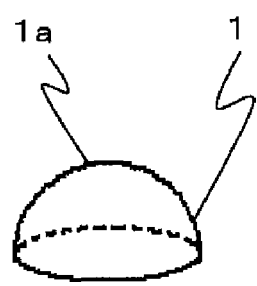
Figure 2A:
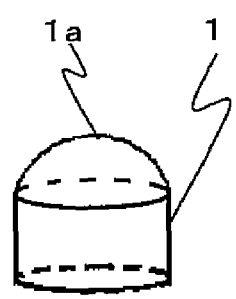

FIG. 1 is a perspective view showing an embodiment of the sample holder of the present invention, and FIG. 2(a) is a partial cross-sectional view of the sample holder of the present invention.

A sample holder 100 of the present invention includes a plurality of convex parts 1 to hold a sample 4 to be mounted on or fixed to a main surface (top face) of a base substance 2. At least contact surfaces of the convex parts 1 with the sample 4 are composed of spherical surfaces 1a formed of a single crystal or amorphous material. The convex parts 1 are fixed to the top face of the base substance 2 via an amorphous joining layer 3.

It is preferable that a gap is formed between the sample 4 held by the convex parts 1 and the joining layer 3. Because the gap is formed between the sample 4 and the joining layer 3, the sample 4 contacts only the convex parts 1, and the flatness of the surface of the held sample 4 to be held is improved, which can contribute to accuracy enhancement of processing and observation of the sample 4.

The base substance 2 is formed of a ceramic sintered body or the like forming a circular-shaped or polygonal-shaped plate-like body or the like. In particular, when the sample holder 100 of the present invention is used in a process using plasma, it is necessary to have plasma resistance. Therefore, the base substance 2 is preferably formed of an alumina sintered body, an yttria sintered body, an yttrium aluminum garnet sintered body, or a silicon nitride sintered body.

In particular, an yttria sintered body has high plasma resistance, which is capable of inhibiting particle generation due to plasma irradiation during the process. Further, an alumina sintered body has plasma resistance next to that of an yttria sintered body, which is suitable for a sample holder used for a semiconductor manufacturing apparatus. Moreover, an alumina sintered body has excellent mechanical characteristics that three-point strength is 300 MPa or more, and Young's modulus is 250 GPa or more, which is capable of stably and precisely holding the sample 4 with a large area. In particular, an alumina sintered body is suitable for a sample holder used for a liquid crystal manufacturing apparatus because the substrates for liquid crystal display devices are made to have larger areas in recent years. Moreover, an alumina sintered body in which yttria particles are dispersed is excellent in both of a mechanical characteristic and a plasma resistance characteristic, which is more suitable.

The convex parts 1 are formed of a single crystal material such as sapphire, ruby, silicon carbide, or crystalline quartz, or an amorphous material such as quartz or borosilicate glass. This is because, when the convex parts 1 are formed of these materials, which do not include crystal grains and voids, there is no particle generation attributed to such crystal grains and voids. Further, a work-affected layer happening to the surface when grinding processing is applied can be easily eliminated by polishing, and it is possible to reduce particle generation due to falling attributed to a work-affected layer. On the other hand, when the convex parts 1 are formed of a polycrystalline substance, there are problems such as particle generation due to falling of crystal grains attributed to a work-affected layer after grinding processing, or that particles at the time of grinding processing fill up voids, and those are generated as particles when it is used as the sample holder 100.

In a case in which the convex parts 1 are formed of a single crystal material or an amorphous material, when a grinding processing is carried out thereon, because the textures of these materials are composed of substantially a same compound, it is easy to transmit resistance applied during the grinding uniformly, which makes it easy to obtain a processed plane with less concavity and convexity. Further, in a case in which the convex parts 1 are formed of a single crystal material, there is no lattice defect, and the strength is high and stable. Therefore, when the apical surfaces, which hold the sample 4, of the convex parts 1 are the spherical surfaces 1a, because it is possible to reduce breaking even when the radius of the curvature is made smaller, and the convex parts 1 are chemically stable, it is possible to reduce impurity interfusion or diffusion into the sample 4.

In particular, in a case in which the convex parts 1 are formed of a single crystal material, it is preferable that the single crystal material has hardness higher than the hardness of glass or silicon structuring the sample 4 to be mounted thereon. Further, in a case in which the convex parts 1 are formed of an amorphous material, quartz is particularly preferable. When these materials are used for the convex parts 1, flaw generation due to frictional wear with the sample 4 does not happen to the convex parts 1. Therefore, it is possible to restrain flaws from being generated in the sample 4 due to mounting of the sample 4 and moving of the sample which are repeated several times.

The surfaces, which hold the sample 4, of the convex parts 1 are the spherical surfaces 1a having shallow curvature, which makes it possible to decrease the contact areas with the sample 4, and to reduce a friction coefficient between the sample 4 and the convex parts 1. Therefore, it is possible to inhibit particle generation from the convex parts 1 in accordance with mounting and moving of the sample 4, and even when it is used in the atmosphere of corrosive gas or plasma thereof, it is possible to further reduce particle generation.

The convex parts 1 are preferably disposed regularly at substantially regular intervals on the main surface of the base substance 2, and are disposed at regular intervals in a radial pattern from the center of the base substance 2 as shown in, for example, FIG. 1. In accordance therewith, it is possible to reduce local distortion and deformation in the sample 4 to be held to stably hold the sample 4.

Figure 2D:
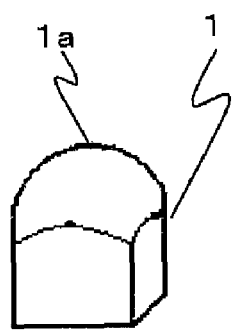

The shapes of the convex parts 1 are selected from among a spherical shape, a hemispherical shape and other shapes in which an apex of a cylinder or a quadrangular prism is a hemispherical shape as shown in FIGS. 2(b) to 2(d), and the like, which can be any shape whose contact surface with the sample 4 to be held is the spherical surface 1a. With respect to the sizes of the convex parts 1. In the case of a spherical shape, its diameter is a 0.5 to 5 mm, and is preferably 1 to 3 mm. In the case of a hemispherical shape or a cylinder or a quadrangular prism whose apex is a hemispherical shape, its diameter of a great circle part is 0.5 to 5 mm, and is preferably 1 to 3 mm, and its height is 0.5 to 5 mm, and is preferably 1 to 3 mm. Note that the terms "spherical shape" and "hemispherical shape" here mean, not mathematically rigorous shapes, but shapes appearing as a spherical shape or a hemispherical shape at first sight as viewed from the top face or at cross section, as shown in FIGS. 2(a) to 2(d). This is because an attempt is made to manufacture the shapes aimed at a rigorous spherical or hemispherical shape ideally, but it is difficult to recreate it in real processes.

The above-described convex parts 1 are fixed by the joining layer 3 formed of an amorphous material, and are composed of glass or the like melting at a calcinations temperature to an extent at which the compositions of the convex parts 1 and the base substance 2 are not transubstantiated. In a case in which the joining layer 3 is formed of glass, it is possible to obtain a surface which is smooth and has few open pores. Accordingly, it is possible to restrain particles from filling up the open pores of the joining layer 3, and to restrain particles from attaching to the sample 4. Further, because an amorphous material does not include minute crystal grains, it is possible to eliminate particle generation attributed to falling of such crystal grains.

In a case in which the sample 4 is a semiconductor wafer used for a semiconductor integrated circuit, a material of the joining layer 3 is preferably an amorphous glass consisting primarily of a compound of phosphorus (P) or boron (B) which is the same as an element doped on the semiconductor wafer, and silicon oxide. In accordance therewith, even if a metal element evaporated from the joining layer 3 diffuses on the sample 4, there is no case in which the sample 4 has an effect on the semiconductor integrated circuit. For the reasons described above, as the joining layer 3, silicate glass ($Na_2O$—$SiO_2$ system), phosphate glass ($P_2O_5$—$SiO_2$ system), or boric acid glass ($B_2O_3$ system) is preferable. Further, because softening temperatures for these glasses are low, even when the convex parts 1 are fixed to the main surface of the base substance 2, it is possible to reduce stress generated at the boundary face between the base substance 2 and the joining layer 3 due to heat history, and a favorable joined body of the base substance 2 and the joining layer 3, and the convex parts 1 and the joining layer 3 is obtained.

For the purpose of lowering the softening temperatures of these glasses, it may be a material in which alkali elements such as Na, K, and Li are mixed up. However, when the concentration of these alkali elements in the glass is made higher, there is a possibility that these elements are evaporated from the glass to diffuse on a semiconductor wafer during the sample holder 100 is used as a part of the semiconductor manufacturing apparatus, a content of these elements is preferably kept as low as possible. For the reasons described above, a total content of alkali elements such as Na, K, and Li to be included is preferably less than or equal to 20% by mass reduced each in terms of oxide, and is more preferably less than or equal to 10% by mass.

Next, a state in which the convex parts 1 are joined to the base substance 2 will be described in detail with reference to FIG. 3.

As shown in FIG. 3, the convex parts 1 and the base substance 2 are formed as separate bodies, and are joined together by the joining layer 3. At this time, it is preferable that the joining layer 3 is not provided between the bottoms of the convex parts 1 and the main surface of the base substance 2, and a structure in which only the side faces of the convex parts 1 are fixed to the base substance 2 by the joining layer 3 is preferable. In accordance therewith, the flatness formed by all the convex parts 1 formed of the spherical surfaces 1a of the plurality of convex parts 1 is improved, and the flatness of the surface of the sample 4 is improved, which can contribute to the accuracy enhancement of processing and observation of the sample.

Moreover, it is preferable that the joining layer 3 is formed on the planes other than the planes on which the convex parts 1 are disposed of the main surface of the base substance 2. When open pores existing in the planes on which the convex parts 1 are not disposed of the main surface of the base substance 2 are filled with the joining layer 3, it is possible to reduce scatter of particles filling up the open pores, which makes it possible to reduce of reattachment of the particles to the sample 4. Or, it is possible to reduce falling of grains generated from the main surface of the base substance 2, which makes it possible to inhibit particle generation.

It is preferable that the glass structuring the joining layer 3 has high wettability for the convex parts 1. In the case of low wettability, boundaries 3a are easily generated at the boundary face between the convex parts 1 and the joining layer 3, and particles easily get into those, and there is a high possibility that particles are scattered to reattach to the sample 4.

Figure 3A:
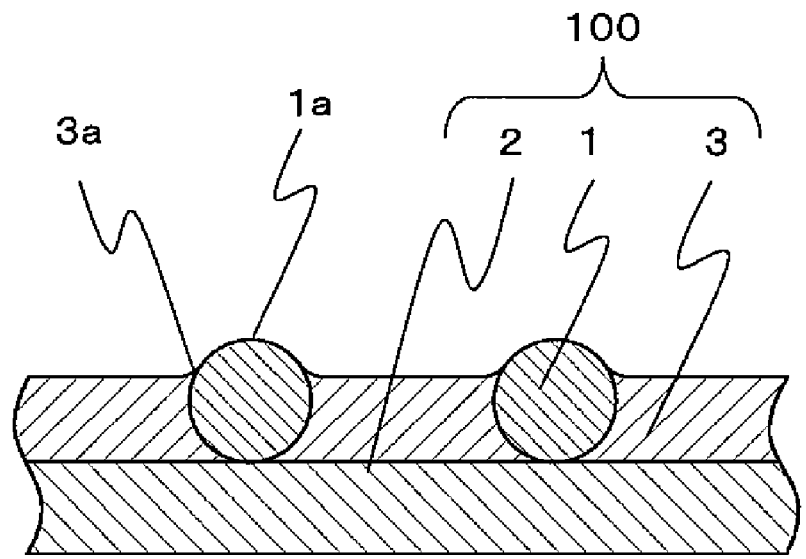
FIGS. 3(a) and 3(b) are cross-sectional views for explanation of the details of FIG. 2.
Figure 3B:
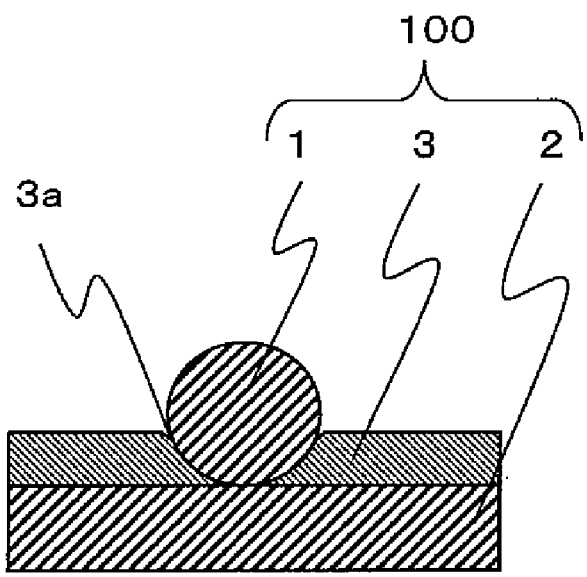

Further, it is preferable to form portions from the spherical surfaces 1a of the convex parts 1 to the joining layer 3 into smooth curved surfaces as shown in FIG. 3(a). This is because, in the case of joining such that there are corners at the boundaries 3a between the spherical surfaces 1a of the convex parts 1 and the joining layer 3 as shown in FIG. 3(b), the boundaries 3a between the convex parts 1 and the joining layer 3 are filled with particles, and there is a possibility that the particles are scattered to reattach to the sample 4.

It is preferable for the joining layer 3 to have open porosity of the surface of 0.1% or less, and major diameters of open pores of 0.1 m or less. Because the joining layer 3 in the sample holder 100 of the present invention is formed of an amorphous material, there are few open pores in the surface. However, provided that the open porosity is made extremely low, which is 0.1% or less, it is possible to reduce attachment of particles generated to the joining layer 3, and provided that the major diameters of the open pores are made to be less than or equal to 0.1 μm, it is possible to effectively reduce entry of the particles generated into the open pores. In accordance therewith, in a case in which the sample 4 to be held is a semiconductor wafer, it is possible to restrain particles problematic when those attach to the semiconductor wafer from attaching to the joining layer 3.

Here, it is recommended to measure the open porosity such that an image of the surface is imported by a CCD camera with a metallographic microscope at a magnification of 200×, and a measuring area of one field of view in the image is set to $2.25 \times 10^{-2}$ mm$^2$, a number of fields of view to be measured is set to 20, and a total measuring area is set to $4.5 \times 10^{-1}$ mm$^2$ by an image analyzer (LUZEX-FS manufactured by Nireco Corporation.).

Then, in accordance with a structure as described above, there is no case in which particles attach to the open pores from which particles are hard to be discharged in the convex parts 1 which are contact parts with the sample 4 and the joining layer 3, which makes it possible to shorten a time of cleaning particles.

It is preferable for the joining layer 3 to have surface roughness with an average interval of local crests (S) of 0.1 μm or less. In accordance therewith, minute protrusions of the joining layer 3 are decreased, which makes it possible to inhibit particle generation due to chipped pieces thereof and the like. Even if particles are generated, because an average interval of local crests is small, it is possible to reduce the attachment of particles. A preferable average interval of local crests (S) is 0.04 μm or less, and it is more preferably 0.03 μm or less.

The spherical surfaces 1a of the convex parts 1 are formed to have surface roughness with a maximum height (Ry) of 0.1 μm or less. Because the convex parts 1 are formed of a single crystal or amorphous material, there are few open pores in the surface, it is possible to reduce the frictional wear for the wafer at the time of absorbing and holding the semiconductor wafer. Further, even when particles are generated, it is possible to restrain the particles from getting into the minute concavo-convex portions of the spherical surfaces 1a of the convex parts 1. Therefore, even when the wafer is repeatedly absorbed and held, it is possible to reduce the frictional wear for the wafer.

Note that an average interval of local crests (S) of the joining layer 3 and a maximum height (Ry) of the spherical surfaces 1a are determined to be measured according to JIS B 0601-1994. An average interval of local crests (S) of the joining layer 3 and a maximum height (Ry) of the spherical surfaces 1a are determined such that 20 areas per 0.01 m$^2$ (100 cm$^2$) on any surface of the spherical surfaces 1a or the joining layer 3 are measured to determine and averaged. Note that a scale of measurement for an average interval of local crests (S) has been set to 0.4 mm when a value less than or equal to 0.1 μm is determined, and has been set to 1.25 mm when a value greater than or equal to 0.1 μm is determined, and a scale of measurement for a maximum height (Ry) has been set to 1.25 mm.

In accordance therewith, in the sample suction device used for an apparatus for manufacturing a semiconductor integrated circuit having circuit wiring in which a pattern width is miniaturized to be approximately 100 nm, in the case of the convex parts 1 and the joining layer 3 formed of single crystals in the present invention, it is possible to reduce generation of particles of approximately 0.1 µm which is a minimum measurable particle diameter by a particle counter.

(Manufacturing Method)

A method for manufacturing the sample holder 100 of the present invention will now be described.

A plate-like ceramic sintered body to be the base substance 2 is prepared. This plate-like ceramic sintered body is determined according to a shape of the sample 4. Next, grinding processing is carried out onto the main surface and the opposite surface of the prepared ceramic sintered body such that the flatness, planarity, surface roughness, and the like are limited within the specified ranges.

Next, a glass paste serving as the joining layer 3 is applied onto the main surface of the base substance 2, and further, the convex parts 1 are disposed at predetermined positions. Here, the application of the glass paste onto the base substance 2 can be formed by a well-known process of manufacture such as screen printing, a casting or doctor blade method, or the like. In order for the joining layer 3 not to be provided between the bottoms of the convex parts 1 and the surface of the base substance 2 as shown in FIG. 3, it is recommended that the glass paste serving as the joining layer 3 be applied after applying masking onto portions, at which the convex parts 1 are disposed, of the main surface of the base substance 2, and the masking be eliminated after drying the glass paste. In order for the joining layer 3 to have the surface roughness with an average interval of local crests (S) of 0.1 µm or less, a heat treatment is carried out in a state in which the glass paste to be the joining layer 3 is applied thereto.

Thereafter, the convex parts 1 are disposed on the main surface of the base substance 2, and a heat treatment is carried out in a state in which the glass paste to be the joining layer 3 is applied thereto. The conditions for the heat treatment are determined in accordance with a transition point of the glass paste. Generally, a holding temperature for the heat treatment is set to be higher by approximately 20 to 90° C. than a softening point of the glass in the glass paste, and a holding time is set to be within the range of 10 to 60 minutes, and a cooling temperature gradient is set to be within the range of 5 to 100° C. per minute. Further, the atmosphere during the heat treatment is not particularly limited, but is preferably the air atmosphere or the nitrogen atmosphere. In order for the spherical surfaces 1$a$ of the convex parts 1 to have surface roughness with a maximum height (Ry) of 0.1 µm or less, approximate shapes of the convex parts 1 are formed by grinding processing, and grinding processing is carried out onto the vicinities of the spherical surfaces 1$a$ of the convex parts 1 by using abrasive grains. In accordance therewith, it is possible to remove flaws during the grinding process.

In the way as described above, it is possible to obtain the sample holder 100 of the present invention. However, for the purpose of reducing the displacement of the convex parts 1 during the heat treatment, it is preferable to fix those while weighting from above the convex parts 1. Further, as another means, places at which the convex parts 1 are disposed on the main surface of the base substance 2 may be processed into concave shapes in advance, and the convex parts 1 may be disposed in the concave portions.

The sample holder 100 obtained in this way can be used suitably as various sample suction device.

(Sample Suction Device)

Figure 4:
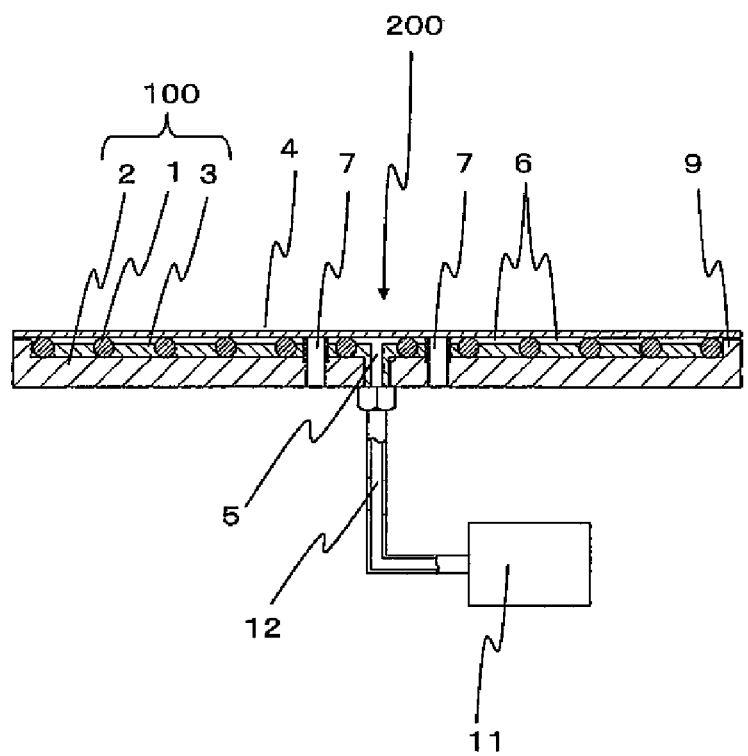
FIG. 4 is a cross-sectional view showing an embodiment of a sample suction device using the sample holder of the present invention.

FIG. 4 is an example of a sample suction device using the sample holder of the present invention. A sample suction device 200 of the present invention includes a sealing wall 9 to form a space 6 making airtight between it and the sample 4 to be held, at the outer edge of the upper main surface of the base substance 2 of the sample holder 100, and includes an exhaust means 11 for exhausting the space 6. This sample suction device is capable of holding the sample 4 by differential pressure generated between the top and the bottom of the sample 4 by attraction. The sample 4 and the sealing wall 9 do not necessarily contact each other, and from the standpoint of reduction of particle generation by friction between the sample 4 and the sealing wall 9, it is preferable to form a gap to an extent that it is possible to obtain the above-described differential pressure enough to absorb the sample 4 during the process.

Then, by connecting the exhaust means 11 such as a pump to an exhaust hole 5, it is possible to exhaust the airtight space 6 made by the rear surface of the sample 4 and the base substance 2, and the sample 4 is held by differential pressure generated on the front-rear surface thereof. This exhaust means 11 is connected to the exhaust hole 5 via an exhaust pipe 12 such as a rubber hose or a synflex tube, and a vacuum pump such as a dry pump or a diaphragm pump is used as the exhaust means 11.

The joining layer 3 appropriately covers the inner side of the exhaust hole 5 inside the exhaust hole 5 as well, which reduces reattachment to the sample 4 of particles generated from the surface of the exhaust hole 5 formed in the base substance 2 from.

Vertical feed pin holes 7 are holes into which vertical feed pins (not shown) to attach and detach the sample 4 to the sample suction device 200 are inserted, and the sealing wall 9 is joined to the vertical feed pin holes 7 through the base substance 2 by the joining layer on. Further, a gap between the top surface of the sealing wall 9 and the rear surface of the sample 4 is preferably made less than or equal to 1 µm. In accordance therewith, there is the effect of reducing intrusion of particles into the airtight space 6 from the vertical feed pin holes 7 at the time of exhausting the airtight space 6. Note that the vertical feed pins are made redundant depending on a method for carrying the sample 4 in some cases.

Another Embodiment

Another embodiment of the sample suction device of the present invention will be described with reference to FIG. 5.

Figure 5:
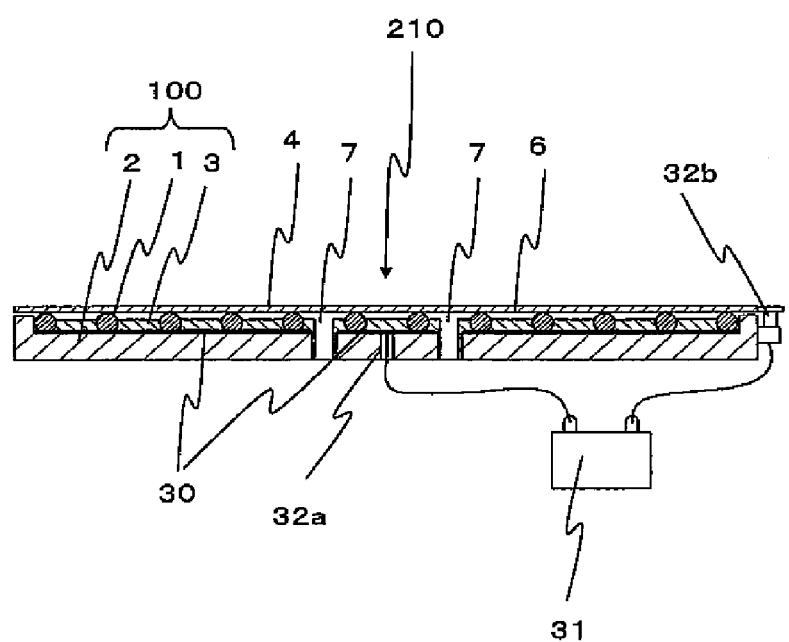
FIG. 5 is a cross-sectional view showing another embodiment of a sample suction device using the sample holder of the present invention.

As shown in FIG. 5, a sample suction device 210 of the present invention is composed of the base substance 2 having the convex parts 1 on the main surface at the upper side, the joining layer 3 to join the convex parts 1 and the base substance 2, an electrode part 30 formed on the main surface of the base substance 2, and a power supply unit 31 to apply an electrical potential to the sample 4. The power supply unit 31 has electrode terminals 32$a$ and 32$b$ to apply electrical potentials, and the electrode terminal 32$a$ is conductive with the electrode part 30, and the electrode terminal 32$b$ is conductive with the sample 4. Then, the sample 4 is held by the spherical surfaces 1$a$ of the respective convex parts 1 due to electrostatic force generated between the electrode part 30 and the sample 4 by applying voltages respectively to the electrode part 30 and the sample 4 from the electrode terminals 32$a$ and 32$b$.

The vertical feed pin holes 7 are provided depending on a method for carrying the sample 4 in the same way as in the sample suction device 200. The vertical feed pin holes 7 are holes into which vertical feed pins (not shown) to attach and detach the sample 4 to the sample suction device 210 are inserted, and the joining layer 3 appropriately covers the inner sides of the vertical feed pin holes 7 inside the vertical feed pin holes 7 as well, which reduces reattachment to the sample 4 of particles generated from the surfaces of the vertical feed pin holes 7 formed in the base substance 2.

It is preferable for the electrode part 30 to be structured such that high melting point metal such as tungsten is adhered as membranes. The reason for this is to reduce diffusion to the joining layer 3 of a material structuring the electrode part 30 from at the time of manufacturing the joining layer 3.

By generating a difference in the electrical potentials between the electrode part 30 and the electrode terminal 32b provided to the base substance 2 from the electric power supply unit 31, electrostatic force generated between the sample 4 and the convex parts 1 is generated, which makes it possible to absorb the sample 4.

In this case, it is possible to absorb the sample 4 by the following two methods. Those are two ways of the so-called "bipolar type" in which the electrode part 30 is divided in two without setting an electrical potential to the sample 4, and different electrical potentials are applied to the respective electrode parts, and the so-called "monopolar type" in which the electrode part 30 is made as a single electrode, and an electrical potential is applied to the sample 4 by disposing the electric power supply unit 31. Note that FIG. 5 is described by using the monopolar type, but it goes without saying that the bipolar type as well can be used.

Another Embodiment

Yet another embodiment of the sample suction device of the present invention will be described with reference to FIGS. 6(a) and 6(b).

Figure 6A:
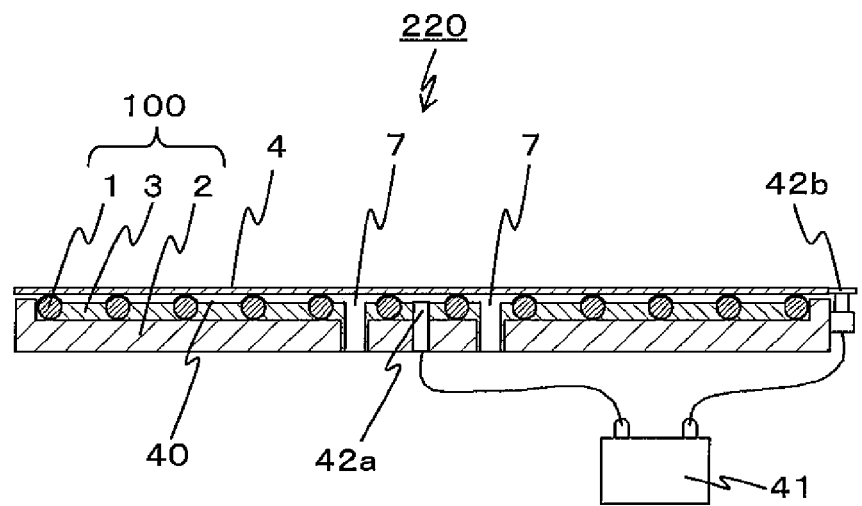
FIG. 6(a) and 6 (b) are a cross-sectional views showing yet another embodiment of sample suction device using the sampler holder of the present invention.

As shown in FIG. 6(a), a sample suction device 220 of the present invention is composed of the base substance 2 having the convex parts 1 on the main surface at the upper side, the joining layer 3 to join the convex parts 1 and the base substance 2, an electrode part 40 formed so as to cover the convex parts 1 and the joining layer 3, a power supply unit 41 to apply electrical potentials to the electrode part 40 and the sample 4, and a dielectric body part 43 formed so as to cover the electrode part 40. Moreover, the power supply unit 41 has electrode terminals 42a and 42b to apply electrical potentials.

Figure 6B:
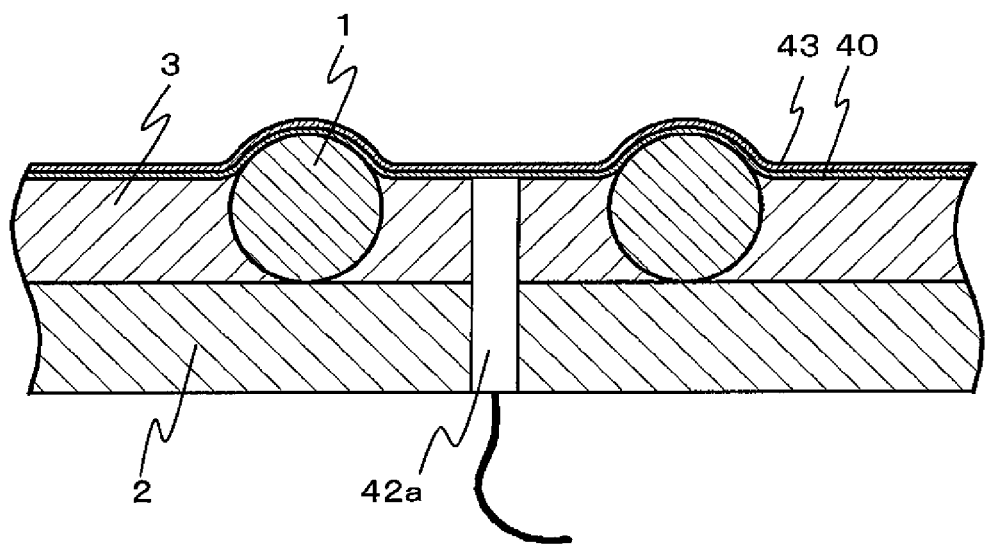

As shown in FIG. 6(b), the electrode part 40 is conductive with the electrode terminal 42a, and top surface thereof is covered with the dielectric body part 43. Then, by applying voltages respectively to the electrode part 40 and the sample 4 from the electrode terminals 42a and 42b by the electric power supply 41, the sample 4 is held due to electrostatic force generated between the sample 4 and the electrode part 40 via the dielectric body part 43.

The vertical feed pin holes 7 are provided depending on a method for carrying the sample 4 in the same way as in the sample suction device 200. The vertical feed pin holes 7 are holes into which vertical feed pins (not shown) to attach and detach the sample 4 to the sample suction device 210 are inserted, and the joining layer 3 appropriately covers the inner sides of the vertical feed pin holes 7 inside the vertical feed pin holes 7, which reduces reattachment to the sample 4 of particles generated from the surfaces of the vertical feed pin holes 7 formed in the base substance 2.

At the time of manufacturing the sample suction device 220, after the convex parts are joined onto the main surface of the base substance 2 by the joining layer 3 formed of an amorphous material, the electrode terminal 42a is attached so as to pass through the base substance 2 and the joining layer 3 without using any adhesive such as screw cramp, press fitting, or the like. It is preferable for the heights of the top surfaces of the electrode terminal 42a and the joining layer 3 to be made substantially the same. Thereafter, by forming the electrode part 40 so as to cover the convex parts 1 and the joining layer 3, the electrode part 40 and the electrode terminal 42a are made conductive with one another, which makes it possible to apply a voltage to the electrode part 40. Thereafter, by forming the dielectric body part 43 so as to cover the electrode part 40, it is possible to reduce appearance on the surface to absorb the sample 4 of the electrode part 40 and the electrode terminal 42a from, and it is possible to reduce electric discharge between the sample 4 and the electrode part 40 at the time of applying a voltage.

Note that, provided that the electrode part 40 and the dielectric body part 43 are adhered as membranes by sputtering, vapor deposition, CVD, or the like, it is possible to make the film thicknesses thinner, which makes it possible to reduce generation of defects of the surface. However, because there are no defects in the convex parts 1 and the joining layer 3 composed of single crystals or amorphous materials, there is no case in which defects are reflected on the membrane surfaces of the electrode part 40 and the dielectric body part 43 as well.

Provided that the sample holding device of the present invention is used, it is possible to reduce the attachment of particles to a sample in various environments, which can contribute to high accuracy and high quality in circuit formations of semiconductor integrated circuits or liquid crystal display devices.

Examples of the present invention will now be described concretely. However, the present invention is not limited to these examples.

EXAMPLES

An example of the present embodiment will now be described by using the sample holder 100 as shown in FIG. 4.

First, a plate-like alumina (90% in purity) sintered body with a diameter of 220 mm×a thickness of 15 mm has been prepared as the base substance 2, and a silicate glass paste has been prepared as the joining layer 3. The convex parts 1 are spherical surfaces with a diameter of 2 mm, and the convex parts 1 formed of, as a material, sapphire which is a single crystal, quartz which is an amorphous material, alumina (99.9% in purity) and silicon nitride (99.9% in purity) which are polycrystalline substances have been prepared in twenty respectively.

The base substance 2 is finished by grinding processing such that the main surface and the rear surface of the sintered body have flatness of 0.002 mm or less, parallelism of the both surfaces of 0.005 mm or less, and surface roughness with an arithmetic average height Ra of 0.4 μm. Further, the top surface of the sealing wall 9 has been finished such that a height form the main surface has been made lower approximately by 10 μm than the convex parts 1, and parallelism with the rear surface of the base substance 2 has been made less than or equal to 0.005 mm. Further, the one exhaust hole 5 with a diameter of 5 mm is prepared in the central part of the base substance 2.

Grinding processing by abrasive grains has been carried out onto the convex parts 1 such that differences in the diameters are made less than or equal to ±2 μm in the respective materials, and the surface roughness of the respective materials have been measured as described in the above-described embodiment according to JIS B 0601-1994. The results are shown in Table 1.

Next, a paste formed of silicate glass is applied onto the main surface of the base substance 2 by screen printing, and the convex parts 1 are disposed at predetermined positions. After masking has been applied onto the portions of the main surface of the base substance 2, at which the convex parts 1 are disposed, a glass paste to be the joining layer 3 has been applied thereto, and the masking has been eliminated after the glass paste has been dried up. Thereafter, a heat treatment is carried out in a state in which the glass paste to be the convex parts 1 and the joining layer 3 has been applied onto the main surface of the base substance 2. As the conditions for the heat treatment, generally, with respect to a temperature trajectory for the heat treatment, a holding temperature is set to be approximately 50° C. higher than a softening point of glass in the glass paste, and a holding time is set to be within the range of 10 to 60 minutes, and climb and cooling temperature gradients are set to be within the range of 5 to 100° C. per minute. At this time, an average interval of local crests (S) on the surface of the joining layer 3 has been measured as described in the above-described embodiment according to JIS B 0601-1994.

The sample holders 100 of samples Nos. 1 to 9 shown in Table 1 have been manufactured.

(Evaluation)

Amounts of particles when a single-crystal silicon made wafer with a diameter of 200 mm has been absorbed to and desorbed from the obtained respective sample holders 100 have been measured, and evaluations thereof have been made in accordance with an increasing amount before and after the absorption and desorption. However, as a wafer, the one after cleaning has been used, and pressure in the airtight space 6 between the wafer and the sample holder 100 has been set to approximately 5 MPa.

The measurement of an increasing amount of particles has been carried out in the following procedure. First, ten wafers have been absorbed to and desorbed from the respective sample holders 100. Next, ultrasonic cleaning of the respective sample holders 100 in deionized water has been carried out for 15 minutes. Then, five wafers have been absorbed and desorbed, and an increasing amount of particles whose particle diameters are greater than or equal to 0.1 μm at the side of an absorbed surface of the wafer is measured every wafer before and after the absorption and desorption, and an average value of the five wafers is determined. The measurement of a number of particles has been executed in a class 10 or less clean room, and with respect to carrying and exchanging of the wafers, the carriages to the sample holders 100 have been performed while holding the rear surfaces of the wafer absorbed surfaces by an airpad by using an automated carrier machine. Numbers of particles at contact areas with the convex parts 1 and respective positions other than the contact areas with the convex parts 1 have been measured by using a laser particle counter (Surfscan 6220 manufactured by KLA-tencor Corporation.).

TABLE 1

| Sample No. | Base substance Materials | Joining layer | | Convex parts | | Particles evaluation (Number of pieces) | |
|---|---|---|---|---|---|---|---|
| | | Materials | Average interval of local crests (S) (μm) | Materials of spherical surface | Maximum height (Ry) (μm) | Contact areas with convex parts | Positions other than contact areas with convex parts |
| 1 | Alumina | Silicate glass | 0.05 | Sapphire | 0.01 | 1 | 2 |
| 2 | Alumina | Silicate glass | 0.06 | Sapphire | 0.01 | 2 | 1 |
| 3 | Alumina | Silicate glass | 0.1 | Sapphire | 0.01 | 1 | 1 |
| 4 | Alumina | Silicate glass | 0.1 | Sapphire | 0.1 | 2 | 2 |
| 5 | Alumina | Silicate glass | 0.1 | Quartz | 0.01 | 1 | 1 |
| 6 | Alumina | Silicate glass | 0.12 | Sapphire | 0.1 | 2 | 8 |
| 7 | Alumina | Silicate glass | 0.12 | Alumina | 0.2 | 9 | 12 |
| 8 | Alumina | Silicate glass | 0.06 | Alumina | 0.2 | 8 | 7 |
| 9 | Alumina | Silicate glass | 0.06 | Silicon nitride | 0.2 | 6 | 6 |

The samples marked "*" are out of the scope of the present invention.

As shown in Table 1, in the samples Nos. 1 to 6 of the present invention in which the convex parts 1 formed of a single crystal are joined via the joining layer 3 formed of an amorphous material, the total values of the increasing numbers of particles at the contact areas with the convex parts 1 and at the positions other than the contact areas with the convex parts 1 are low from 2 to 10, and particle generation has been inhibited.

In contrast thereto, in the samples Nos. 7 to 9 in which the convex parts 1 are formed of polycrystalline ceramics, which are out of the scope of the present invention, the total values of the increasing numbers of particles at the contact areas with the convex parts 1 and at the positions other than the contact areas are 12 to 21, and a great number of particles have been generated.

The invention claimed is:

1. A sample holder for holding a sample, comprising:
a base substance comprising a ceramic sintered body; and
a plurality of convex parts comprising contact faces contacted with the sample and being fixed to the base substance via a joining layer comprising an amorphous material,
wherein the contact faces are composed of spherical surfaces comprising a single crystal material.

2. The sample holder according to claim 1, wherein a gap is formed between the sample to be held on the convex parts and the joining layer.

3. The sample holder according to claim 1, wherein the joining layer is formed on a plane other than planes at which the convex parts are disposed of the top face of the base substance.

4. The sample holder according to claim 1, wherein a top face of the joining layer comprises smooth curved surfaces connecting with the spherical surfaces of the convex parts.

5. The sample holder according to claim 1, wherein the joining layer has surface roughness with an average interval of local crests (S) of 0.1 μm or less.

6. The sample holder according to claim 1, wherein the spherical surfaces has surface roughness with a maximum height (Ry) of 0.1 μm or less.

7. The sample holder according to claim 1, wherein the base substance is comprised of an alumina sintered body.

8. The sample holder according to claim 7, wherein the base substance is comprised of an alumina sintered body in which yttria particles are dispersed.

9. A sample suction device comprising;
the sample holder according to claim 1;
a sealing wall to form a space making airtight between the base substance and the sample to be held, at an outer edge of the top face of the base substance; and
an exhaust means for exhausting the space,
wherein the sample is absorbed by differential pressure from the outside of the space.

10. A method for executing processing for a sample by using the sample suction device according to claim 9, the method comprising:
an absorption step of making the sample holder absorb the sample;
a processing step of performing at least one of processes of grinding, inspection, and carriage; and
a desorption process of desorbing the sample from the sample holder.

11. The sample holder according to claim 1, wherein said faces of the convex parts are fixed to the base substance via the joining layer.

12. The sample holder according to claim 1, wherein the joining layer comprises a glass.

13. A sample holder for holding a sample, comprising;
a base substance; and
a plurality of convex parts comprising contact faces contacted with the sample, and being fixed to a top face of the base substance via a joining layer comprising an amorphous material,
wherein the contact faces are composed of spherical surfaces comprising a single crystal or amorphous material, and
the joining layer fills up at least one part of open pores existing in the planes on which the convex parts are not disposed of the main surface of the base substance.

14. A sample holder for holding a sample, comprising;
a base substance; and
a plurality of convex parts comprising contact faces contacted with the sample, and being fixed to a top face of the base substance via a joining layer comprising an amorphous material,
wherein the contact faces are composes of spherical surfaces comprising a single crystal or amorphous material, and
wherein the joining layer has open porosity of the surface of 0.1% or less, and major diameters of open pores of 0.1 µm or less.

15. A sample suction device comprising;
a sample holder for holding a sample, comprising:
a base substance; and
a plurality of convex parts comprising contact faces contacted with the sample, and being fixed to a top face of the base substance via a joining layer comprising an amorphous material; and
an electrode part being formed on the top face of the base substance,
wherein the contact faces are compises of spherical surfaces comprising a single crystal or amorphous material, and
the sample is absorbed by generating electrostatic force between the base substance and the sample.

16. A sample suction device comprising;
a sample holder for holding a sample, comprising;
a base substance; and
a plurality of convex parts comprising contact faces contacted with the sample, and being fixed to a top face of the base substance via a joining layer comprising an amorphous material: and
an electrode part;
and a dielectric body part being formed to be laminated on the top face of the convex parts and the joining layer, and
wherein the contact faces are composed of spherical surfaces comprising a single crystal or amorphous material, and
the sample is absorbed by generating electrostatic force between the electrode part or the dielectric body part and the sample.

* * * * *